United States Patent
Kim et al.

(10) Patent No.: US 6,529,002 B1
(45) Date of Patent: Mar. 4, 2003

(54) HIGH ORDER SHIMMING OF MRI MAGNETIC FIELDS USING REGULARIZATION

(75) Inventors: Dong-Hyun Kim, Mountain View, CA (US); Daniel M. Spielman, Menlo Park, CA (US); Gary H. Glover, Stanford, CA (US); Elfar Adalsteinsson, Palo Alto, CA (US)

(73) Assignee: The Board of Trustees of The Leland Stanford Junior University, Palo Alto, CA (US)

(*) Notice: Subject to any disclaimer, the term of this patent is extended or adjusted under 35 U.S.C. 154(b) by 0 days.

(21) Appl. No.: 09/653,637

(22) Filed: Aug. 31, 2000

(51) Int. Cl.[7] .................................................. G01V 3/00
(52) U.S. Cl. ......................... 324/312; 324/307; 324/309
(58) Field of Search ................................. 324/312, 307, 324/309, 318

(56) References Cited

U.S. PATENT DOCUMENTS

| | | | |
|---|---|---|---|
| 4,740,753 A | 4/1988 | Glover et al. | 324/320 |
| 4,899,109 A * | 2/1990 | Tropp et al. | 324/319 |
| 4,973,111 A * | 11/1990 | Haacke et al. | 324/309 |
| 4,987,371 A | 1/1991 | Glover et al. | 324/320 |
| 5,168,232 A * | 12/1992 | Glover et al. | 324/307 |
| 5,218,299 A * | 6/1993 | Dunkel | 324/307 |
| 5,228,443 A * | 7/1993 | Tatar | 600/409 |
| 5,343,151 A | 8/1994 | Cory et al. | 324/320 |
| 5,517,115 A * | 5/1996 | Prammer | 324/303 |
| 5,539,316 A * | 7/1996 | Sukumar | 324/318 |
| 5,592,091 A | 1/1997 | Manabe | 324/320 |
| 5,614,827 A * | 3/1997 | Heid | 324/319 |
| 5,617,028 A | 4/1997 | Meyer et al. | 324/320 |
| 5,617,029 A | 4/1997 | Schneider | 324/320 |
| 5,677,854 A | 10/1997 | Dorri | 364/578 |
| 5,841,891 A * | 11/1998 | Windig et al. | 324/312 |
| 6,043,652 A * | 3/2000 | Liu | 324/309 |

OTHER PUBLICATIONS

Kim, D.H. Et Al., "SVD Regularization Algorithm for Improved High–Order Shimming," Proc. Intl. Soc. Mag. Reson. Med. 8, p. 1685, Apr. 3, 2000.

* cited by examiner

*Primary Examiner*—Edward Lefkowitz
*Assistant Examiner*—Dixomara Vargas
(74) *Attorney, Agent, or Firm*—Townsend and Townsend and Crew LLP; Henry K. Woodward

(57) ABSTRACT

Disclosed is a method for regularized high-order shimming of a magnetic field in an MRI system. In one application a spiral pulse sequence is used to acquire field maps, and based on the user selection a shimming region, a least squares calculation of shim currents is performed that minimizes the root mean square (RMS) value of the $B_0$ in homogeneity-over the volume of interest. The singular value decomposition (SVD) is used to enable regularized methods for solving the least squares problem. The regularization allows arbitrary regions to be shimmed without the divergence of shim currents.

9 Claims, 9 Drawing Sheets

SE

SSEPI
linear shim

SSEPI
linear +
nonlinear shim

HIGH ORDER SHIMMING OF MRI MAGNETIC FIELDS USING REGULARIZATION

STATEMENT AS TO RIGHTS TO INVENTIONS MADE UNDER FEDERALLY SPONSORED RESEARCH AND DEVELOPMENT

The U.S. Government has rights in the disclosed invention pursuant to the National Institute of Health contract with Stanford University, contract no. NIH CA 48269 and RR 09784.

BACKGROUND OF THE INVENTION

This invention relates generally to magnetic resonance imaging (MRI), and more particularly the invention relates to the shimming of the magnetic fields within the MRI system.

Magnetic resonance imaging (MRI) is a non-destructive method for the analysis of materials and for medical imaging. It is generally non-invasive and does not involve ionizing radiation. In very general terms, nuclear magnetic moments are excited at specific spin precession frequencies which are proportional to the local magnetic field. The radio frequency signals resulting from the precession of the spins are received using pickup coils. By manipulating the magnetic fields, an array of signals is provided representing different regions of the volume. These are then combined to produce a volumetric image of the nuclear spin density of the body.

A uniform magnetic field is required in the MRI system for image data acquisition. Shim coils are provided in the system which can be selectively energized to improve magnetic field uniformity. Many methods exist for shimming, and the use of a field map to adjust shim currents is a common method. Reference field maps are routinely used to correct for magnetic field inhomogeneity by solving a set of linear equations. While methods for adjustments of linear shim currents for shimming exists, the use of high-order shims has been shown to be of substantial benefit for imaging applications of the brain as well as other body applications. Common approaches for linear shimming include computing optimal linear shim terms for a given metric over the volume of interest and then applying the corresponding currents as constant offsets to the imaging gradients. Similar methods has been investigated for high-order shimming. Calculating the correct field from a reference field map using least squares fit is a typical shimming approach. Variants of this method exist where the current limits of shim coils are taken into account.

Shimming via field mapping methods vary in the way that the field maps are actually obtained. Multiple spin echo methods have been used to obtain the field maps, but faster methods have been used to improve the overall speed of the shimming procedure.

The shim coils in the MRI system are designed as spherical harmonics, which are only guaranteed to be orthogonal over a centered spherical region of interest (ROI). While high-order shimming provides increased homogeneity, shimming in areas that are off-centered or non-spherical can cause numerical instability due to the non-orthogonality of shim fields.

The present invention is directed to an improved method of shimming a magnetic field through use of a reference field map of the MRI system and a volumetric field map of the field of view within an object to be imaged. Shim currents are calculated for the volumetric field map using data from the reference field map and the volumetric field map. Importantly, a regularization method is then applied in recalculating the shim currents for use in energizing the shim coils.

The invention and objects and features thereof will be more readily apparent from the following detailed description and appended claims when taken with the drawings.

SUMMARY OF THE INVENTION

In accordance with the invention, the shimming of a magnetic field for use in magnetic resonance imaging of a field of view includes obtaining data for a reference field map of the magnetic field, and then obtaining data for a volumetric field map of the field of view within the object. Shim currents are calculated for the volumetric field map using the acquired data. Thereafter, regularization is iteratively applied in re-calculating the shim currents, which are then applied to energize shim coils.

A spiral pulse sequence can be used to acquire the field maps, and a least-squares calculation of shim currents is performed that minimizes the root mean square (RMS) value of the magnetic field inhomogeneity over the volume of interest. A singular value decomposition (SVD) is used to enable regularized methods for solving the least-squares problem. The regularization allows arbitrary regions to be shimmed without the divergence of shim currents.

The invention and objects and features thereof will be more readily apparent from the following description and appended claims when taken with the drawings.

DESCRIPTION OF THE SPECIFIC EMBODIMENTS

Figure 1:
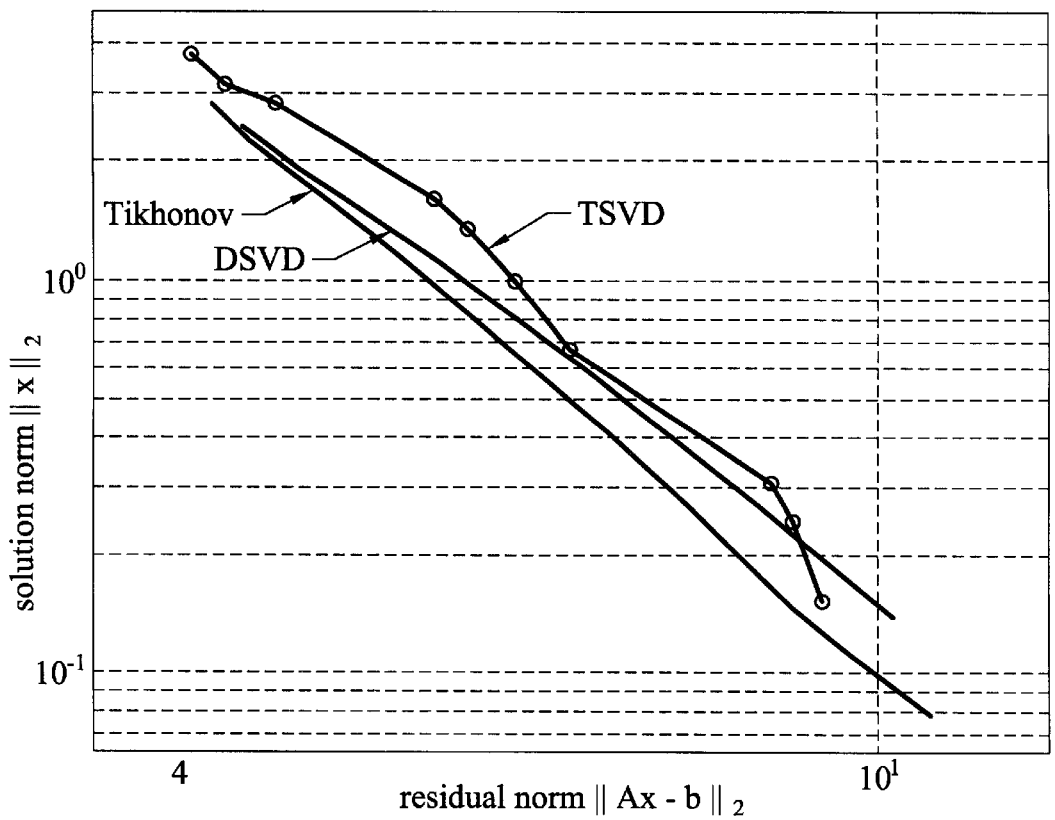
FIG. 1 is a plot of residual of Norm versus Solution Norm for various regularization methods.

High order shimming in accordance with the invention includes regularization of field map data. Theory behind the regularization is presented which is based on singular value decomposition of the reference field map.

To determine the correct shim currents, reference field map data and the field map of the object being scanned are collected using the sequence described herein below. The reference field map is represented by a matrix where each column corresponds to the field generated by each shim. The field map of the object is also represented as a vector. Once the user has determined the ROI, those points that correspond to the ROI are extracted from the reference field map and field map of the object.

Optimal shim currents are then obtained via a least-squares solution of the equation $$Ax=b \quad [1]$$

where A is a N×10 matrix of the extracted reference field map, N is the number of points extracted, b is a vector containing the measured field map of the object, and x is a 10×1 vector of the desired currents. The solution is obtained with the help of a singular value decomposition of the matrix A $$A = UWV^T = \sum_{i=1}^{r} \sigma_i u_i v_i^T \quad [2]$$

where Rank(A)=r, W=diag($\sigma_1 \ldots \sigma_r$), U=[$u_1 \ldots u_r$], V=[$v_1 \ldots v_r$]. The solution to Eq. [1] could be found via the pseudo inverse of A. Thus, $$x = A^\dagger b = \sum_{i=1}^{r} \frac{u_i^T b}{\sigma_i} v_i \quad [3]$$

where $A^\dagger$ is the pseudo inverse of A ($A^\dagger = V\Sigma^{-1}U^T$). Depending on the selected ROI, the condition number, k(A), of the matrix A can be large, leading to an ill-conditioned matrix. This situation implies that two or more shims have similar effects on the selected ROI. For example, when shimming an axial slice, x and zx will be the same within a scaling factor. Likewise, for a highly off-centered ROI, the high-order shims, which are designed to match spherical harmonics, are not orthogonal, leading to a large condition number.

The effect of a large condition number is readily determined by considering the cases for error in the acquired field map b, and also for error in the reference field map A. First, an error in the field map, which we call δb will propagate into the solution current by $$\frac{\|\delta x\|}{\|x\|} \leq k(A) \frac{\|\delta b\|}{\|b\|}. \quad [4]$$

Thus, an error in the field map (δb) can lead to errors in the calculated shim currents (δx) that are proportional to the condition number of the reference map, which could possibly lead to a diverging solution. Likewise, an error in the reference map, which we call δA will propagate into the solution current by $$\frac{\|\delta x\|}{\|x + \delta x\|} \leq k(A) \frac{\|\delta A\|}{\|A\|}. \quad [5]$$

From eq. [4] and [5], it can be seen that despite small errors in the reference field map and the field map of the object, it can lead to significant shimming errors when the ROI is such that high condition numbers are at stake. This will also effect the root means square (RMS) of the residual norm. An expression for the above two cases are given by $$\|\delta r\| \leq \frac{\|\delta A\|}{\|A\|} \|x\| \|A\| + \|\delta x\| + \frac{\|\delta A\|}{\|A\|} k(A) \|r\| \quad [6]$$

where r is the residual when no errors are present, and δr is the residual error when errors are present in both the field map of the object and reference map.

Various regularization methods exist for cases of ill-conditioned matrices. Examples are Tikhonov regularization, damped SVD (DSVD) regularization method truncated SVD (TSVD) method, and thresholding method. We considered several of these choices and two of these methods, namely the thresholding method and the modified version of the TSVD were implemented and experimented on our system. FIG. 1 illustrates the solution norm vs. residual norm of various methods for a ROI chosen to be the frontal lobe of the brain. The residual norm vs. the solution norm is shown for three regularization methods for one in vivo subject data. The ROI was chosen to be the frontal lobe of the brain. All three methods give similar results in terms of solution and residual norms. Depending on the ROI, the curve does not necessarily become L-shaped as a function of $\|Ax-b\|$, which can lead to difficulty in finding the optimal solution.

In our implementation of the thresholding method, the singular values of the matrix A were truncated to give a condition number below a certain empirically determined threshold number. But, the nature of the condition number does not only depend on the non-orthogonality of the shims themselves, but also on the ROI selected, thus making this method valid for studies of specific ROIs. For example, in studies of frontal lobe shimming, the thresholding of condition number to be below 50 gave stable results. In the modified version of the TSVD, the values of $\sigma_i$, $|u_i^T b|$ and $|u_i^T b/\sigma_i|$ is determined, and from this, corresponding singular values with high $|u_i^T b/\sigma_i|$ are nulled out. From eq. [3], it is seen that singular values with large $|u_i^T b/\sigma_i|$ contribute significantly to the norm of the solution. A large solution norm could require correction currents to be bigger than the value used for the generation of the reference map. If the variance of the reference map is $\sigma_{2ref}$, and the current offset used to generate the reference map is $\Delta C_{ref}$, the standard deviation of the correction current would be proportional to (7)

$$\frac{\Delta C}{\Delta C_{ref}} \sigma_{ref} \quad [7]$$

where ΔC is the required correction current. Thus, high solution norm, which is proportional to ΔC, can lead to unstable performance. Although eliminating the singular values with large $|u_i^T b/\sigma_i|$ decreases the solution norm, the trade off comes from the residual norm. The residual norm, which gives the RMS value of the shimming capability, is determined by $|u_i^T b|$, since this is the projection onto the desired output b. Taking out singular values will degrade the RMS of the residual norm, and especially those with high $|u_i^T b|$ contribute significantly to the RMS.

For field inhomogeneity measurements, we used a multislice interleaved spiral acquisition with an echo time difference of 2 ms. We acquired a three-dimensional reference field map over a 32×32×24 cm field of view (FOV) with 32×32×32 pixels in our GE Signa 3T scanner equipped with maximum gradient amplitude of 3.5 G/cm and slew rate of 20 G/cm/ms. The parameters resulted in a 5.3 ms data acquisition timing and a total scan time of 4 seconds. Also, for high resolution shimming, 20×20×20 cm FOV with 128×128×32 pixel resolution was acquired. In this case, due to the long acquisition timing, a 16 interleave spiral was used. The parameters resulted in a 3.5 ms data acquisition timing for each interleave and a total scan time of 34 seconds. TE was 7 ms, TR was 1 second and flip angle was 60 degrees. For reference field map generation, we used multiple averages to increase the SNR of the field map.

The method for acquiring reference field map is similar to that described by Webb et al., Magn Keson Med, 20:113–122 (1991). The reference field map was acquired for three linear gradients (x, y and z) and 6 high-order shims (xy, zx, zy, $x^2-y^2$, $z^2$ and $z^3$). For each shim, the offset current was chosen to be the largest value that did not show a phase wrap or significant signal dropout. This offset current value was set as the reference current for that shim. This procedure was done for all the linear and high-order shims. After all the shim currents were determined, a baseline field map was subtracted and a reference field map matrix was constructed using the combination of the 9 vectors from the 9 field maps acquired plus a constant vector term to represent the center frequency term. These vectors serve as a basis function for the reference field map. Note that for each MR system, this procedure needs to be done only once.

For phantom and in vivo studies, the field map of the object is generated with the same sequence and timing parameters described above. The ROI is selected and corresponding portions from the reference field map and object field map are extracted to form eq. [1]. A magnitude image is also generated to eliminate portions of the selected ROI that has insufficient signal intensity. Optimal shim currents are calculated according to the method described above and downloaded automatically upon user's request.

Figure 2:
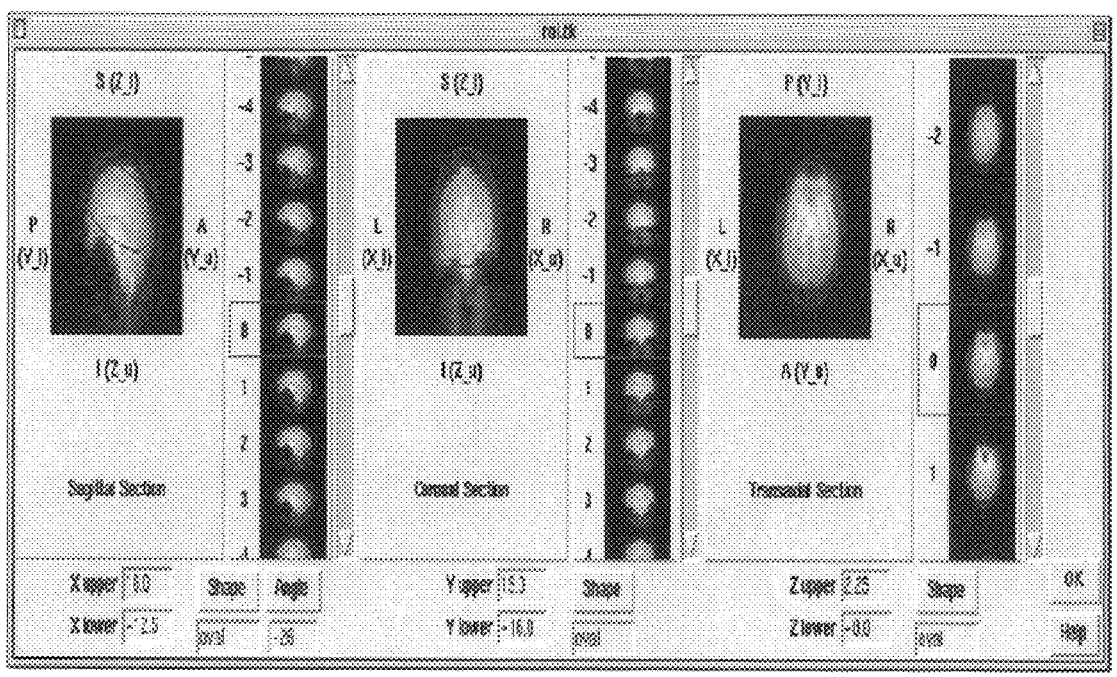
FIG. 2 illustrates three snapshots of a ROI selection interface.

All studies were conducted under the development of a graphic user interface (GUI) which allows the whole shimming procedure to be automated step by step as well as an interface which allows easy selection of ROI. FIG. 2 shows a snap shot of the ROI selection interface. This implementation of a GUI shimming package enabled many clinical studies to routinely perform high-order shimming as a means of prescan. The entire shimming procedure was packaged into the graphic interface. This portion shows the user's selection of ROI. The images are updated after each spiral scan. Note that selecting the ROI in one plane (e.g. axial) updates the ROI in the other two planes.

Figure 4B:
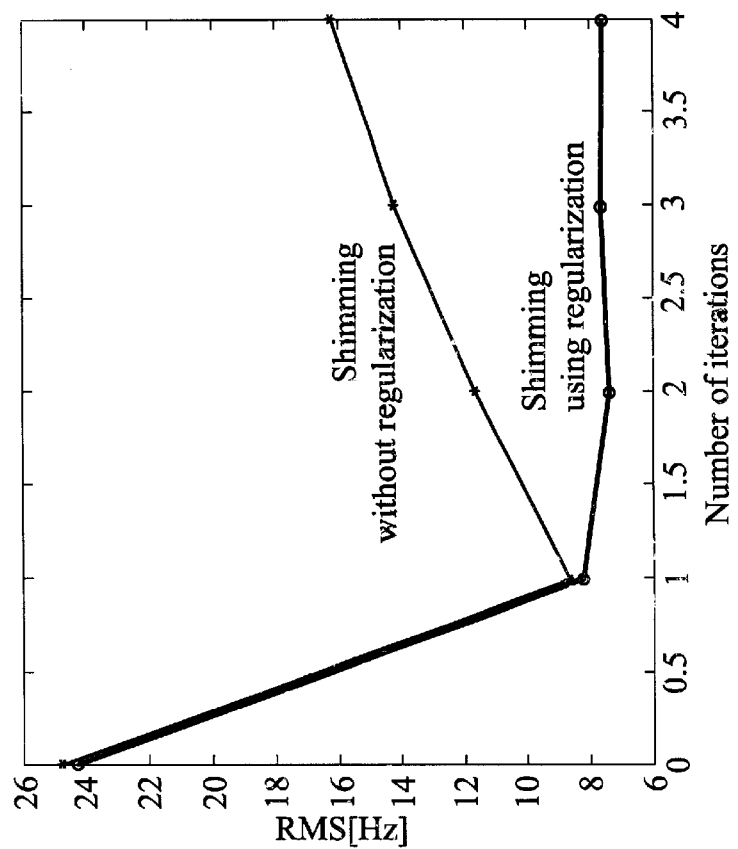
FIGS. 4A and 4B illustrate a comparison of high order shimming with and without regularization.
Figure 4A:
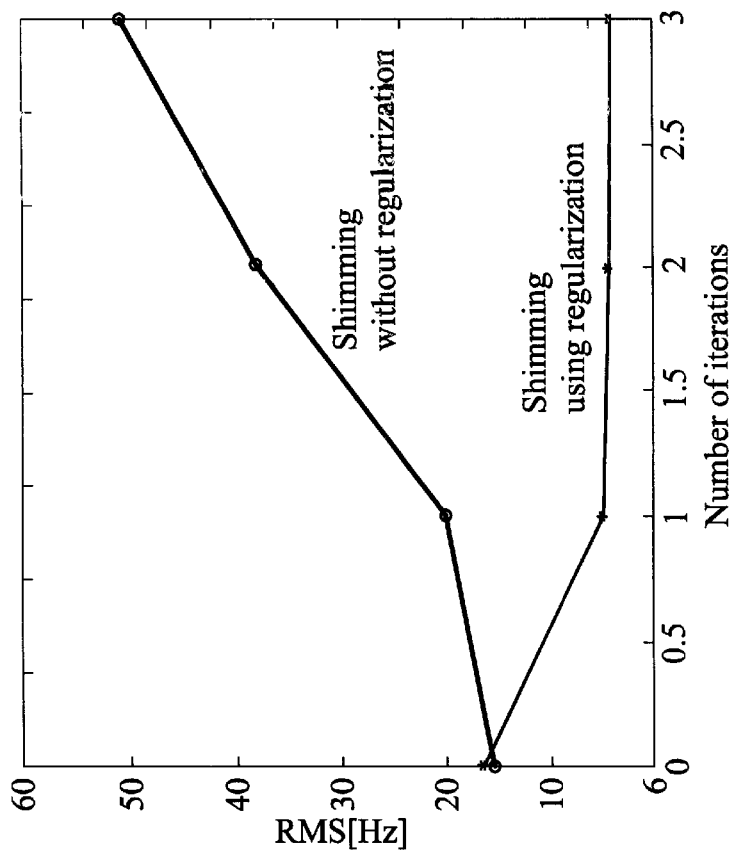

To validate the need of regularization on off-centered ROIs, we demonstrate a situation of such. FIGS. 4A and 4B show an example of shimming with and without regularization using the thresholding method. The RMS field deviation vs. number of iterations where ROI was selected to be such that divergence of the currents are likely for a spherical phantom. FIG. 4A shows divergence even at first iteration where as in FIG. 4B divergence can be seen after the first iteration. Initial condition or field map error can lead to different results for the same off-centered ROI. The regularization method used was thresholding the condition number of the matrix to be under a certain number. It shows that divergence can be observed even at the first iteration depending on factors such as the initial condition or field map errors. As mentioned, the thresholding method thresholds the condition number to a certain value. In our system, 50 was a reasonable value for shimming off-centered regions of the brain.

Figure 3:
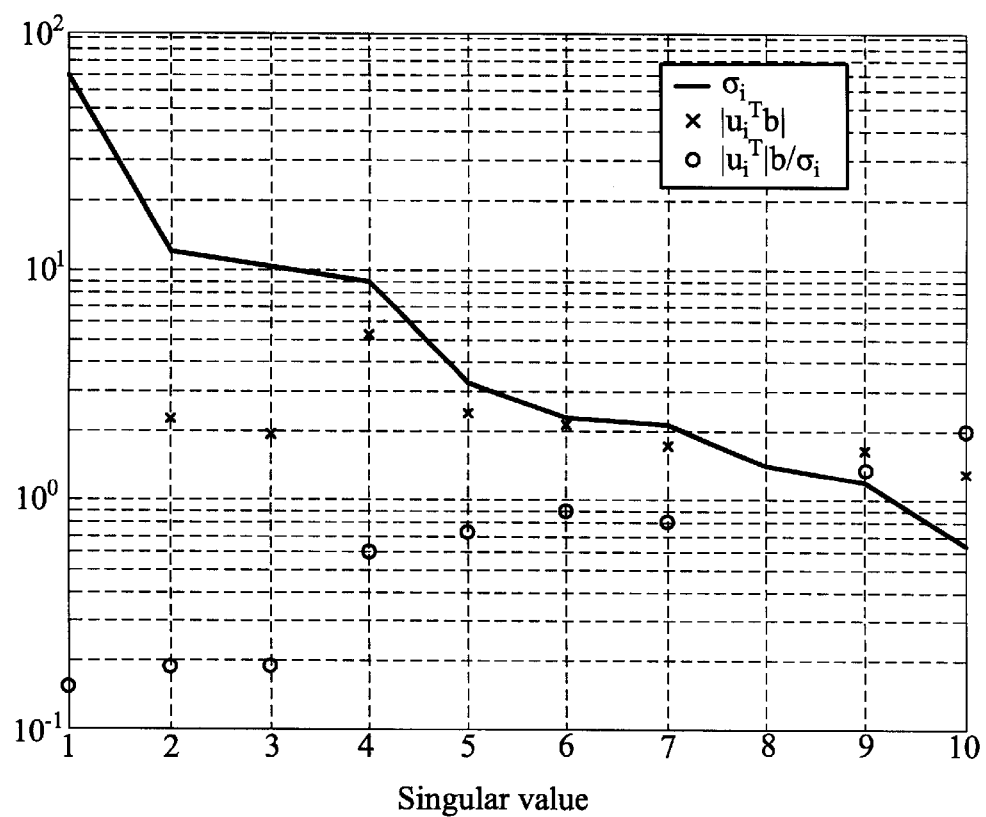
FIG. 3 is a plot of singular values versus $\sigma_i$.

For more general usage to other areas, a modified version of truncated SVD method was implemented. This method of regularization is illustrated with the example in FIG. 3. This plot is used to null out certain singular values. In this case, which is from the data in FIG. 1, the 8, 9 and 10th singular values are nulled out due to relatively large values of $|u_i^T b/\sigma_i|$. Nulling out the 8th singular value will increase the residual norm due to the large $|u_i^T b|$ value, since the residual norm inversely depends on the projection vector $|u_i^T b|$. (Note the increased residual norm in FIG. 1 for TSVD after the nulling of 3rd singular value.) An initial study comparing linear versus linear +high-order shim terms was conducted with 6 normal volunteers on the 3T magnet. In vivo field maps in which the ROI was selected to be the whole brain yielded an average RMS field deviation of 26.5±1.6 Hz using just linear shims alone. In contrast, using the three linear terms in combination with six higher order terms achieved an average RMS field deviation of 16.5±1.3 Hz. The average baseline field deviation before any shimming was performed was 61.2±3.2 Hz.

Figure 5:
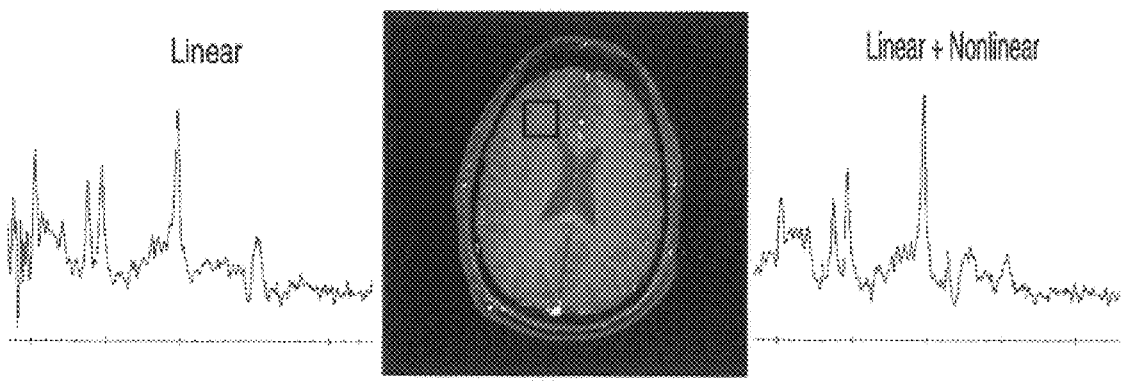
FIG. 5 illustrates linear and non-linear shim in an off-centered ROI at 3T.

FIG. 5 shows spectra from a single voxel in vivo spectroscopy study where the ROI is off-centered. Compared with the linear shims alone, water suppression is enhanced and metabolite peaks are sharpened with the use of high order shimming. This sequence uses a CHESS water suppression technique. Middle) Scout scan and the selected ROI. Left) Spectrum using linear shims. Right) Spectrum using all shims available.

Figure 6A:
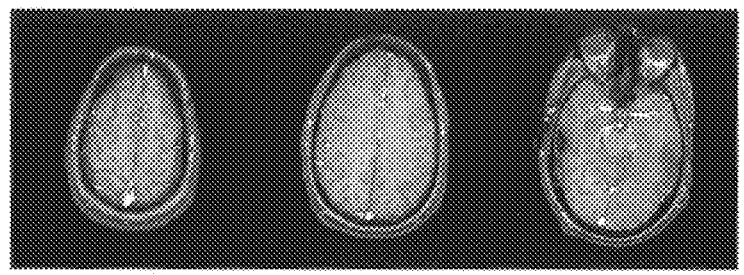
FIGS. 6A, 6B, 6C illustrate spin echo, single shot echo planar with linear shim, and single shot echo planar with linear and non-linear shim in accordance with the invention.
Figure 6B:
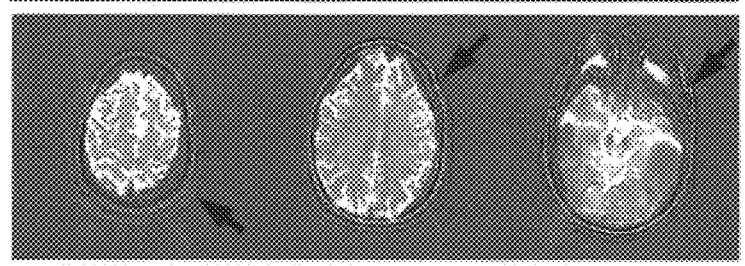
Figure 6C:
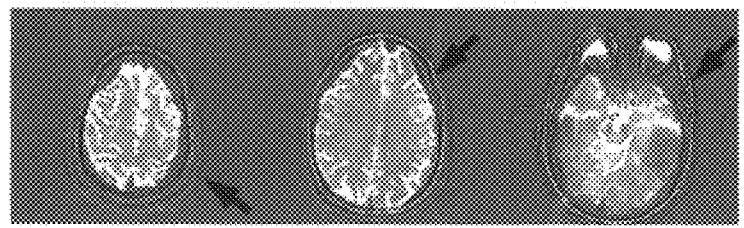

FIG. 6 illustrates high-order shimming with a single-shot echo-planer image (SSEPI) sequence which is highly dependent on field homogeneity. The SSEPI images were overlaid with an edge detected version of the image on the top row for improved visualization of distortion artifacts. Note the geometric distortion tends to shrink the image in the AP direction. The amount of distortion is decreased with the use of high-order shims. For each slice displayed, the geometric distortion due to $B_0$ inhomogeneity is reduced through the use of high-order shims.

Figure 7:
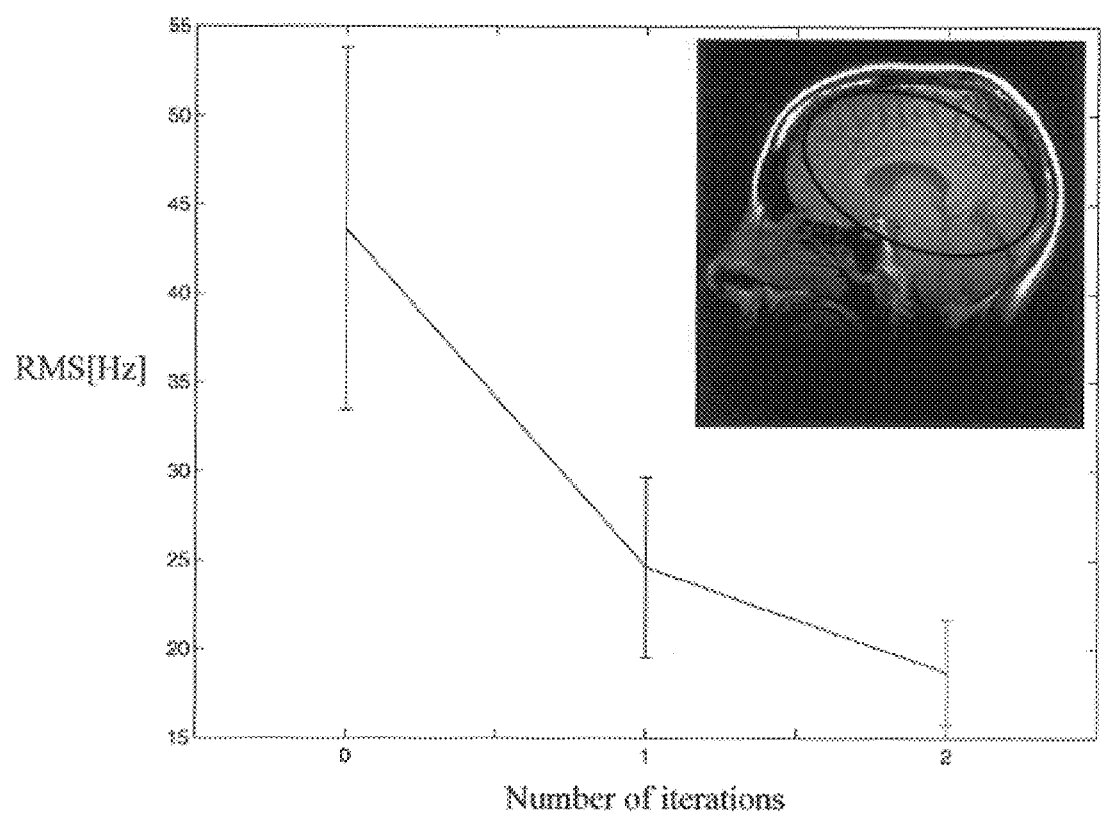
FIG. 7 is a plot of RMS value of field maps within an ROI with high-order shimming at 3T.

FIG. 7 shows data from 10 in vivo volunteers with ROI selected to be an oblique off-center whole brain. For each of the ten cases, the ROI was chosen to be from oblique off-center covering most of the brain. No cases observed divergence of the residual norm nor any observance of diverging shim currents. The achieved average RMS was approximately 0.15 ppm at 3T (18 Hz).

Figure 8:
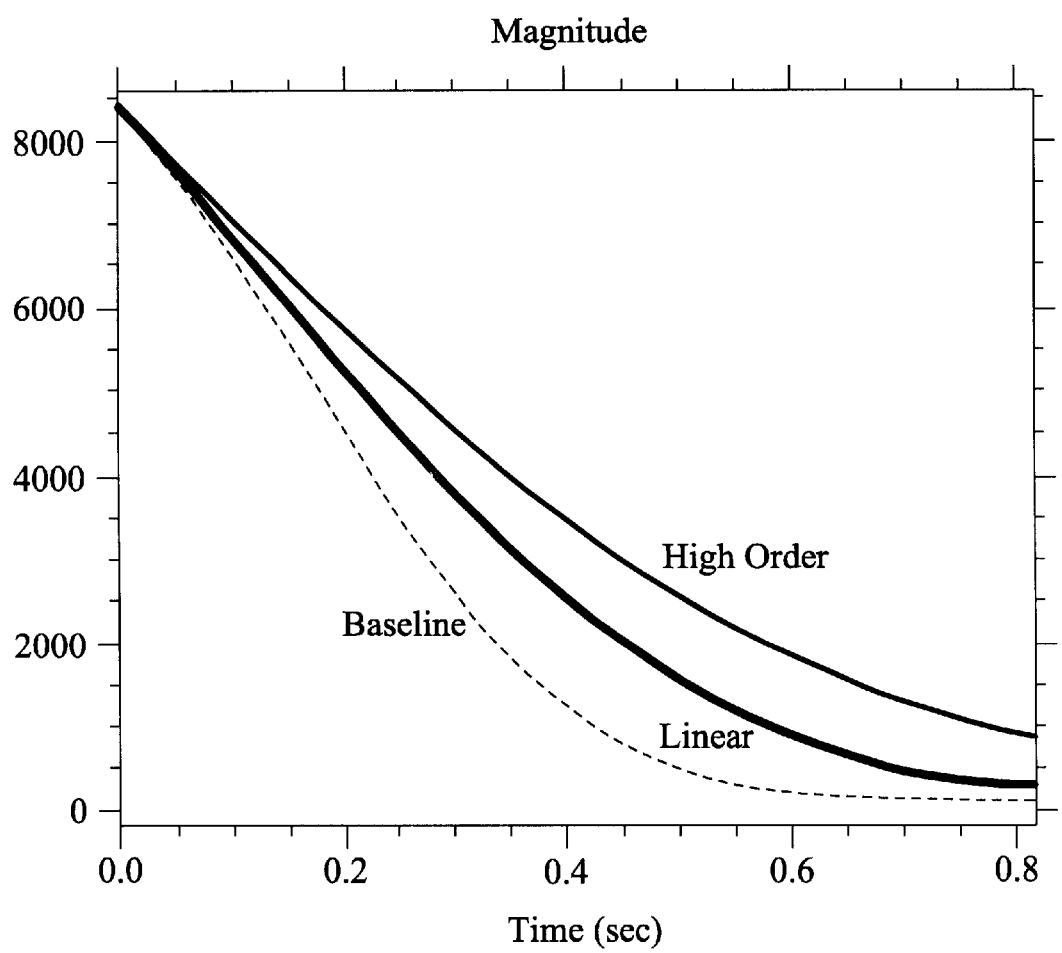
FIG. 8 is a plot of FID comparison using high resolution shimming.

Shimming of small ROIs using the high resolution field map was also investigated. FIG. 8 shows the improvement in free induction decay (FID) achieved for phantom with ROI selected over a voxel size of 1 cc. A separate reference field map was constructed for this implementation. The achieved RMS value before after high order shimming was 5.18 Hz and 1.53 Hz, respectively.

Our results demonstrate the successful implementation of high-order shimming using regularization methods, which is particularly useful in shimming off-centered ROIs where shims fields are non-orthogonal and reference maps ill-conditioned. The regularization method prevents solution currents from diverging by keeping the solution norm small. Use of spiral acquisition sequence for field mapping and a graphic interface allows one iteration to be run in about 20 seconds including field map acquisition, shim current calculation and download of the calculated, typically, one or two iterations are sufficient for shimming as is seen from FIG. 7.

Sources of error comes largely from the noise in the reference field map and also from the field map of the object being shimmed. The reference field map, due to its nature of being acquired only once for each magnet, was obtained using several averages to maximize SNR. Our SNR of the reference field map was approximately 50. Although shims are constructed to be spherical harmonics, the actual field produced does not guarantee orthogonality of shims for centered spherical ROI. The following Table 1 illustrates the non-orthogonality of these shims by calculating the inner product between each shims for a centered spherical ROI:

TABLE 1

|  | x | y | z | xy | zx | zy | $x^2-y^2$ | $z^3$ | $z_2$ |
|---|---|---|---|---|---|---|---|---|---|
| x | 1.0000 | 0.1627 | 0.0696 | 0.2463 | 0.1283 | 0.1781 | 0.1153 | 0.0856 | 0.0758 |
| y |  | 1.0000 | 0.0632 | 0.1350 | 0.2065 | 0.2585 | 0.1481 | 0.1039 | -0.0168 |
| z |  |  | 1.0000 | 0.0634 | 0.0766 | -0.0017 | 0.1583 | 0.5257 | 0.0761 |
| xy |  |  |  | 1.0000 | 0.1260 | 0.1892 | 0.1583 | 0.0643 | 0.1133 |
| zx |  |  |  |  | 1.0000 | 0.1517 | 0.1421 | 0.1012 | 0.1075 |
| zy |  |  |  |  |  | 1.0000 | 0.1723 | -0.0113 | 0.0879 |
| $x^2-y^2$ |  |  |  |  |  |  | 1.0000 | 0.1254 | 0.1353 |
| $z^3$ |  |  |  |  |  |  |  | 1.0000 | 0.0693 |
| $z^2$ |  |  |  |  |  |  |  |  | 1.0000 |

|  | x | y | z | xy | zx | zy | $x^2-y^2$ | $z^3$ | $z_2$ |
|---|---|---|---|---|---|---|---|---|---|
| x | 1.0000 | 0.0341 | 0.0112 | 0.0568 | 0.0198 | 0.0090 | 0.0722 | 0.0094 | -0.0078 |
| y |  | 1.0000 | 0.0072 | 0.0051 | 0.1044 | 0.0534 | 0.0518 | -0.0084 | -0.0491 |
| z |  |  | 1.0000 | 0.0347 | -0.0139 | 0.1332 | 0.0382 | -0.2516 | -0.0288 |
| xy |  |  |  | 1.0000 | 0.0351 | 0.1160 | 0.0606 | 0.0392 | 0.0023 |
| zx |  |  |  |  | 1.0000 | 0.0604 | 0.0502 | 0.1589 | -0.0131 |
| zy |  |  |  |  |  | 0.0604 | 0.0801 | 0.1177 | -0.0756 |
| $x_2-y^2$ |  |  |  |  |  | 1.0000 | 1.0000 | 0.0335 | 0.0080 |
| $z^3$ |  |  |  |  |  |  |  | 1.0000 | -0.0713 |
| $z^2$ |  |  |  |  |  |  |  |  | 1.0000 |

The correlation between the z and $z^3$ shim is very high compared with other site's field map. It can also be argued that the implementation of the spherical harmonics does not comprise an orthogonal basis of the reference field map to begin with. Due to this high correlation, when shimming over off-centered ROIs, the high correlation of field maps becomes yet more magnified leading to ill-conditioned reference maps. The regularization algorithm serves as a very powerful means for stabilizing divergent currents which can arise in these situations, even with the non-orthogonal basis functions to begin with.

Figures 9A, 9B, 9C:
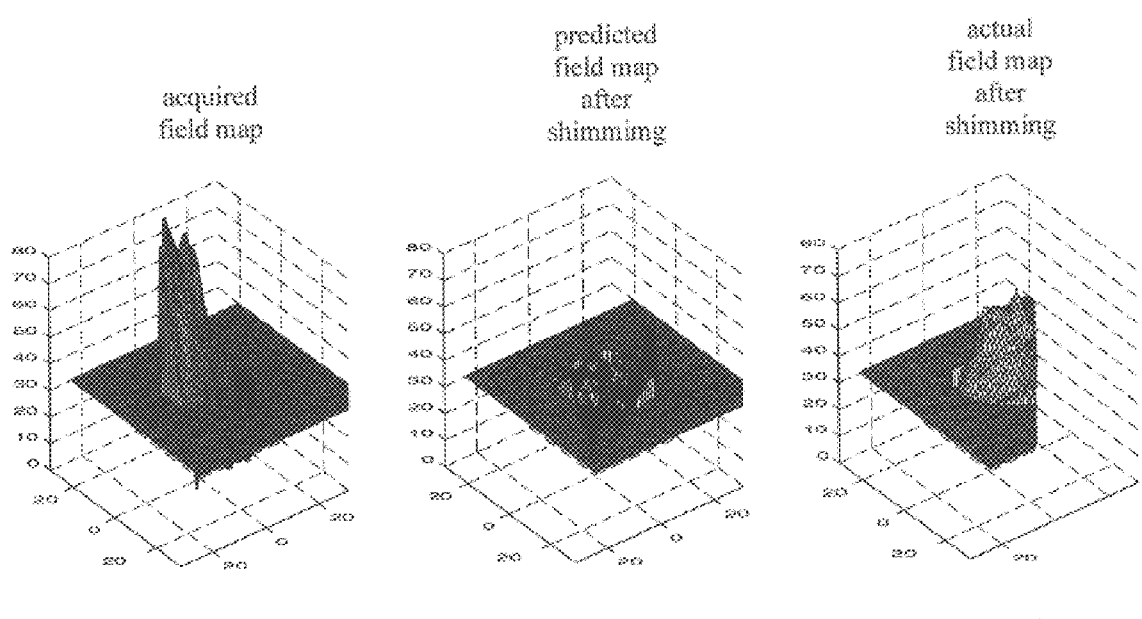
FIGS. 9A–9C illustrate in vivo field maps before and after shimming including an acquired field, a predicted field map after shimming, and an actual field map after shimming.

The field map of the subject being shimmed is more vulnerable to errors. Scan to scan variation can be a substantial factor when shimming in vivo subjects due to motion. Also, the incapability of shimming to reach its predicted value are more likely to come from errors in the field map of the subject than from the reference map. FIGS. 9A–9C illustrate the field map differences between predicted field map before shimming and the achieved field map after shimming. Field maps differ between the predicted field map and actual field map. Each scan to scan variation as well as noise in initial field maps propagate into predicted and actual field maps. The RMS of each field map was 22.5 Hz, 6.76 Hz, and 9.32 Hz from left to right. The predicted residual field represents fields that are orthogonal to the basis function, i.e., the fields that are by definition unshimmable if no errors are present. Cases when errors in the field map of the object is prevalent, iteration of shimming algorithm is performed to converge to a minimum norm. A closer examination of any unique characteristics of the unshimmable components can lead to dedicated coil design issues to discard this field.

Eq. [4]–[6] relate directly to errors in the field maps. The SNR is inversely proportional to $\|\delta b\|/\|b\|$ and $\|\delta A\|/\|A\|$. Thus, low SNR in both the reference field map and field map of the object can put higher upper bounds to $\delta x$ even when the condition number of the reference field map is low.

Current output is limited in the shim supply. For our system, the maximum current output is ±4 amps for each channel. Due to the regularization algorithm which limits solution norm, thus limiting current output, we have never had a situation when more than maximum allowed currents were needed. In our implementation of high resolution shimming, the offset currents used for making reference maps were much higher than the ordinary case. Therefore, current constraints can be an issue when executing high resolution shimming. Methods such as outlined by Wen and Saffer, *Mag Reson Med*, 34:898–904 (1995) need to be incorporated in this case.

The described invention presents a method of high-order shimming using regularized algorithm which is useful for shimming in general, and for off-centered ROIs specifically. The whole shimming procedure can be integrated into an automated user-friendly software package which is especially useful for clinical studies due to its easy usage.

While the invention has been described with reference to specific embodiments, the description is illustrative of the invention and not limiting the invention. Various modifications and applications will be obvious to those skilled in the art without departing from the true spirit and scope of the invention as defined by the appended claims.

What is claimed is:

1. A method of shimming a magnetic field for use in magnetic resonance imaging of a field of view within an object, said method comprising the steps of:

a) obtaining data for a reference field map of the magnetic field, b) obtaining data for a volumetric field map of the field of view within the object, c) calculating shim currents for the volumetric field map using data from steps a) and b), d) applying regularization iteratively in recalculating the shim currents, and e) energizing shim coils using currents calculated from step d).

2. The method as defined by claim 1 wherein step c) calculates shim currents according to Ax=b where A is a N×10 matrix of the extracted reference field map, N is the number of points extracted, b is a vector containing the measured field map of the object, and x is a 10×1 vector of the desired currents.

3. The method as defined by claim 2 and including a singular value decomposition of the matrix A $$A = UWV^T = \sum_{i=1}^{r} \sigma_i u_i v_i^T$$

where Rank(A)=r, W=diag($\sigma_1 \ldots \sigma_r$), U=[$u_1 \ldots u_r$], V=[$v_1 \ldots v_r$].

4. The method as defined by claim 3 wherein step c) is solved by an inverse of A as follows:

$$x = A^\dagger b = \sum_{i=1}^{r} \frac{u_i^T b}{\sigma_i} v_i$$

where $A^\dagger$ is the pseudo inverse of A ($A^\dagger = V\Sigma^{-1}U^T$).

5. The method as defined by claim 4 wherein step d) is selected from Tikhonov regularization, damped singular value decomposition (DSVD) regularization, truncated SVD (TSVD), and thresholding method.

6. The method as defined by claim 5 wherein a thresholding method is employed and singular values of the matrix A are truncated to give a condition number below an empirically determined threshold number.

7. The method as defined by claim 6 wherein the condition number is defined as $$\sigma_1/\sigma_r$$

where $\sigma_1 \, \sigma_2 \ldots \sigma_r > 0$.

8. The method as defined by claim 7 wherein variance of the reference map is $\sigma^2_{ref}$, and the current offset used to generate the reference map is $C_{ref}$, the standard deviation of the correction current is proportional to $$\frac{\Delta C}{\Delta C_{ref}} \sigma_{ref}$$

where C the required correction current.

9. The method as defined by claim 1 wherein step d) is selected from Tikhonov regularization, damped singular value decomposition (DSVD) regularization, truncated SVD (TSVD), and thresholding method.

* * * * *